United States Patent
Ishibashi

(10) Patent No.: US 8,846,533 B2
(45) Date of Patent: Sep. 30, 2014

(54) CLEANING SOLUTION FOR SUBSTRATE FOR SEMICONDUCTOR DEVICE

(75) Inventor: Youichi Ishibashi, Wakayama (JP)

(73) Assignee: Kao Corporation, Tokyo (JP)

( * ) Notice: Subject to any disclaimer, the term of this patent is extended or adjusted under 35 U.S.C. 154(b) by 143 days.

(21) Appl. No.: 12/936,304

(22) PCT Filed: May 18, 2009

(86) PCT No.: PCT/JP2009/059478
§ 371 (c)(1),
(2), (4) Date: Oct. 4, 2010

(87) PCT Pub. No.: WO2009/145124
PCT Pub. Date: Dec. 3, 2009

(65) Prior Publication Data
US 2011/0027995 A1    Feb. 3, 2011

(30) Foreign Application Priority Data

May 26, 2008   (JP) .................. 2008-137199

(51) Int. Cl.
| | | |
|---|---|---|
| C09K 13/00 | (2006.01) | |
| B44C 1/22 | (2006.01) | |
| C03C 15/00 | (2006.01) | |
| C03C 25/68 | (2006.01) | |
| H01L 21/302 | (2006.01) | |
| H01L 21/461 | (2006.01) | |
| B08B 7/04 | (2006.01) | |
| C11D 1/14 | (2006.01) | |
| C11D 11/00 | (2006.01) | |
| H01L 21/02 | (2006.01) | |

(52) U.S. Cl.
CPC .......... *H01L 21/02065* (2013.01); *C11D 1/146* (2013.01); *C11D 11/0047* (2013.01); *H01L 21/02074* (2013.01)
USPC .......... 438/692; 438/689; 438/691; 438/693; 216/52; 216/53; 216/89; 134/10; 134/12; 252/79.1; 252/79.2; 252/79.3; 252/79.4; 252/79.5

(58) Field of Classification Search
None
See application file for complete search history.

(56) References Cited

U.S. PATENT DOCUMENTS

| | | | |
|---|---|---|---|
| 5,750,031 | A | 5/1998 | Rahman et al. |
| 6,426,007 | B1 * | 7/2002 | Sachdev et al. ............... 210/663 |
| 2005/0170981 | A1 * | 8/2005 | Mun et al. ..................... 510/201 |
| 2005/0284844 | A1 | 12/2005 | Hattori et al. |
| 2006/0054193 | A1 * | 3/2006 | Van Kralingen et al. ....... 134/42 |
| 2006/0270573 | A1 | 11/2006 | Ikemoto et al. |
| 2008/0045016 | A1 | 2/2008 | Andou et al. |

FOREIGN PATENT DOCUMENTS

| | | |
|---|---|---|
| CN | 1918698 A | 2/2007 |
| EP | 1 892 285 A2 | 2/2008 |
| JP | 2001-68444 A | 3/2001 |
| JP | 2001-131221 A | 5/2001 |
| JP | 2004-203901 A | 7/2004 |
| JP | 2004-323840 A | 11/2004 |
| JP | 2005-048000 A | 2/2005 |
| JP | 2005-260213 A | 9/2005 |
| JP | 2006-41494 A | 2/2006 |
| JP | 2006-347920 A | 12/2006 |
| JP | 2008-47842 A | 2/2008 |
| WO | WO 97/12281 A1 | 4/1997 |

OTHER PUBLICATIONS

International Search Report for PCT/JP2009/059478 mailed Aug. 21, 2009.
Chinese Office Action for Application No. 200980118553.4 dated Dec. 22, 2011 (with English translation).
Notification of Reason for Rejection for corresponding Japanese Application No. 2008-137199. mailed on Jul. 26, 2012.

* cited by examiner

*Primary Examiner* — Nadine Norton
*Assistant Examiner* — Stephanie Duclair
(74) *Attorney, Agent, or Firm* — Birch, Stewart, Kolasch & Birch, LLP

(57) ABSTRACT

A cleaning solution of the present invention contains a sodium ion, a potassium ion, an iron ion, an ammonium salt of a sulfuric ester represented by General Formula (1), and water, and each content of the sodium ion, the potassium ion, and the iron ion is 1 ppb to 500 ppb. $ROSO_3$—$(X)+$ (1) where R is an alkyl group with a carbon number of 8-22 or an alkenyl group with a carbon number of 8-22, and $(X)+$ is an ammonium ion.

14 Claims, No Drawings

CLEANING SOLUTION FOR SUBSTRATE FOR SEMICONDUCTOR DEVICE

TECHNICAL FIELD

The present invention relates to a cleaning solution that is used in the course of producing a semiconductor device, in particular, for cleaning the surface obtained by subjecting an object to be polished such as an insulating film to chemical mechanical polishing (CMP), a method for producing the cleaning solution, and a method for producing a substrate for a semiconductor device using the cleaning solution.

BACKGROUND ART

The production process of a semiconductor device such as a memory IC, a logic IC, or a system LSI includes the step of forming an interlayer insulating film and the like. In these steps, a flattening technique is adopted, if required. Therefore, the CMP enabling satisfactory flattening is receiving attention.

In the course of the CMP, a slurry in which grains of silica, ceria, alumina, or the like are dispersed in an aqueous solvent or the like are supplied to an insulating film. The surface of the insulating film immediately after the completion of the CMP is contaminated with polishing waste, components derived from the slurry, and the like. These contaminants have adverse effects on the electrical characteristics of a semiconductor device, so that it is necessary to remove the contaminants by cleaning and rinsing. As the cleaning solution used in the cleaning step after the CMP, for example, the following detergent compositions are disclosed (see, for example, Patent Literatures 1-4).

Patent Literature 1 discloses a detergent composition that contains a water-soluble polymer with a particular weight-average molecular weight (e.g., 1000 to 100000) and $NR_4OH$ (R is a hydrogen atom or an alkyl group with a carbon number of 1-6) and that is used for cleaning a wiring board after the CMP.

Patent Literature 2 discloses a detergent composition that contains an organic acid such as acetic acid, an organic alkali component $((R)_4N^+OH^-$, where $R_1$ is a hydrogen atom, a hydroxyl group, an alkoxy group, or an alkyl group that may be replaced by halogen), an anionic surfactant such as alkylsulfonic acid or a salt thereof, and water, and that is used for cleaning the surface having metal wiring after the CMP.

Patent Literature 3 discloses a detergent composition that contains a nonionic surfactant and water, and that is used for cleaning the surface having metal wiring after the CMP.

Patent Literature 4 discloses a detergent composition that contains at least one selected from the group consisting of a sulfonate ($R^1SO_3M^1$), a sulfuric ester salt ($R^2OSO_3M^2$), a sulfosuccinate or an ester salt, and an organic phosphonate, and water, and that is used for cleaning the surface having copper wiring after the CMP. $R^1$ and $R^2$ are alkyl groups with a carbon number of 1-6 or alkenyl groups with a carbon number of 2-6, and $M^1$ and $M^2$ are atoms other than hydrogen atoms or molecules that are to be cations.

The following literatures (Patent Literatures 5 and 6) do not describe that chemical products described in the respective Patent literatures are used as cleaning solutions; however, they describe that it is desirable to reduce the content of impurities such as alkali metal, regarding chemical products used in the field of a semiconductor device.

Patent Literature 5 discloses a method for producing an ionic polymer compound used preferably in the field in which the reduction of impurities is desired. The ionic polymer compound is obtained by treating an aqueous solution containing ionic low-molecular weight impurities and an ionic polymer compound having a salt-generating group with an ion exchange resin and thereafter, neutralizing the aqueous solution. The weight-average molecular weight of the ionic polymer compound is preferably 500 to 500,000.

Patent Literature 6 discloses a sulfocarboxylic acid agent containing sulfocarboxylic acid as a main component and further containing a trace amount of alkali metal. The sulfocarboxylic acid agent is used as an additive for a plating bath. Patent literature 6 discloses a problem that the insulation between circuits becomes defective when sodium ions remain in an electronic component, and that the content of alkali metal in the sulfocarboxylic acid agent is reduced using the ionic exchange resin.

CITATION LIST

Patent Literature

[Patent Literature 1] JP 2006-41494A
[Patent Literature 2] JP 2005-260213A
[Patent Literature 3] JP 2004-323840A
[Patent Literature 4] JP 2004-203901A
[Patent Literature 5] JP 2001-131221A
[Patent Literature 6] JP 2006-347920A Impurities such as sodium ions, potassium ions, and iron ions remain on the surface that is cleaned with a detergent composition and then is rinsed with ultra-pure water or the like. Recently, the demand for the cleanness of the surface of a semiconductor device substrate constituting a semiconductor device is becoming very high along with the fining of the semiconductor device.

The cleanness of the cleaned surface is influenced not only by the contaminants remaining immediately after the completion of the CMP but also by the impurities and the like contained in the detergent composition. Patent Literature 1 discloses that the total amount of sodium and potassium in the detergent composition is set to be 0.02 ppm or less, preferably 0.01 ppm or less, and more preferably 0.005 ppm or less, and Patent Literature 2 discloses that the contents of metal impurities such as Na, K, and Fe respectively are set to be 10 ppm or less, preferably 1 ppm or less, and more preferably 0.3 ppm or less. However, the cleanness of the cleaned surface is not sufficient even using any of the detergent compositions described in Patent Literatures 1-4.

It also is known to clean and rinse the surface after the CMP with ultra-pure water in place of the above-mentioned detergent composition. However, in this case, a large amount of ultra-pure water is required, which incurs a large cost, and the burden of waste liquid on the environment is large.

An attempt was made to use the ionic polymer compound described in Patent Literature 5 as a cleaning solution. However, the ionic polymer compound adsorbed to the surface to be cleaned, with the result that a highly cleaned surface was not obtained.

An attempt was made to use the sulfocarboxylic acid agent described in Patent literature 6 as a cleaning solution. In this case, a highly cleaned surface was not obtained, either.

SUMMARY OF INVENTION

Technical Problem

The present invention provides a cleaning solution for a substrate for a semiconductor device capable of obtaining a highly cleaned surface, a production method thereof, and a method for producing a substrate for a semiconductor device using the cleaning solution.

Solution to Problem

A cleaning solution for a substrate for a semiconductor device of the present invention contains a sodium ion, a potassium ion, an iron ion, an ammonium salt of a sulfuric ester represented by General Formula (1), and water, and each content of the sodium ion, the potassium ion, and the iron ion is 1 ppb to 500 ppb.

$$ROSO_3^-(X)^+ \tag{1}$$

where R is an alkyl group with a carbon number of 8-22 or an alkenyl group with a carbon number of 8-22, and $(X)^+$ is an ammonium ion.

A method for producing a cleaning solution of the present invention includes treating an aqueous solution containing a sodium ion, a potassium ion, an iron ion, and a sulfuric ester anion represented by General Formula (2) with a cation exchange resin and an anion exchange resin, thereby reducing each content of the sodium ion, the potassium ion, and the iron ion in the aqueous solution, and adding a non-metallic amine based alkali agent to the aqueous solution treated with the cation exchange resin and the anion exchange resin. The cleaning solution contains a sodium ion, a potassium ion, an iron ion, an ammonium salt of a sulfuric ester represented by General Formula (3), and water, and each content of the sodium ion, the potassium ion, and the iron ion is 1 ppb to 500 ppb.

$$ROSO_3^- \tag{2}$$

where R is an alkyl group with a carbon number of 8-22 or an alkenyl group with a carbon number of 8-22.

$$ROSO_3^-(X)^+ \tag{3}$$

where R is an alkyl group with a carbon number of 8-22 or an alkenyl group with a carbon number of 8-22, and $(X)^+$ is an ammonium ion.

A method for producing a substrate for a semiconductor device of the present invention includes chemically and mechanically polishing a thin film placed on a principal plane side of a silicon wafer, cleaning the thin film obtained by the chemical mechanical polishing using the cleaning solution for a substrate for a semiconductor device of the present invention, and bringing the thin film obtained in the cleaning into contact with ultra-pure water.

Advantageous Effects of Invention

According to the present invention, a cleaning solution for a substrate for a semiconductor device capable of obtaining a highly cleaned surface, a production method thereof, and a method for producing a substrate for a semiconductor device using the cleaning solution can be provided.

DESCRIPTION OF EMBODIMENTS

The inventors of the present invention found that it is possible to obtain a highly cleaned surface by using a particular ammonium salt of a sulfuric ester as a main component of a cleaning solution for a substrate for a semiconductor device (hereinafter, which may be referred to merely as a "cleaning solution") and setting the contents of sodium ions, potassium ions, and iron ions to be 1 ppb to 500 ppb, respectively. Hereinafter, the cleaning solution of the present invention will be described.

(Embodiment 1)

The cleaning solution of the present invention contains sodium ions, potassium ions, iron ions, a particular ammonium salt of a sulfuric ester, and water, and is used for cleaning the surface that is chemically and mechanically polished in the course of the production of a semiconductor device.

Hereinafter, each component contained in the cleaning solution of the present invention will be described.

(Ammonium Salt of a Sulfuric Ester)

A particular ammonium salt of a sulfuric ester contained in the cleaning solution of the present invention has a function of removing particulate and/or ionic metal adhering to the surface to be cleaned and is represented by the following General Formula (1).

$$ROSO_3^-(X)^+ \tag{1}$$

In General Formula (1), R is an alkyl group with a carbon number of 8-22 or an alkenyl group with a carbon number of 8-22, and $(X)^+$ is an ammonium ion.

The carbon number of R is preferably 10 to 18 and more preferably 11 to 15 in terms of enhancing the cleaning property. Specific examples of R include alkyl groups or alkenyl groups such as capryl, caprin, decyl, lauryl, myristyl, palmityl, stearyl, arachidyl, behenyl, or oleyl. In terms of enhancing the cleaning property, the ammonium salt of a sulfuric ester is preferably ammonium decyl sulfate and ammonium lauryl sulfate, and more preferably ammonium lauryl sulfate.

$(X)^+$ is an ammonium ion $(NH_4^+)$ in terms of enhancing the cleaning property.

A weight-average molecular weight Mw of the above-mentioned ammonium salt of a sulfuric ester is preferably less than 500, more preferably 450 or less, and much more preferably 400 or less in terms of enhancing the detergency.

The weight-average molecular weight Mw is a value calculated based on a peak in a chromatogram obtained by applying a gel permeation chromatography (GPC) method under the following conditions.

Column: G4000PWXL+G20000HXL (manufactured by Tosoh Corporation)
Eluant: (500 mol of acetic acid)/(THF)=9/1 (content ratio)
Flow rate: 1.0 mL/min.
Column temperature: 40° C.
Detector: RI detector
Reference material: polysulfonic acid The content of the above-mentioned ammonium salt of a sulfuric ester in the cleaning solution of the present invention is preferably 11 to 70% by weight, more preferably 13 to 70% by weight, much more preferably 13 to 60% by weight, and still more preferably 14 to 50% by weight in terms of enhancing the detergency.

(Metal Ions (Sodium Ions, Potassium Ions, Iron Ions))

The contents of sodium ions, potassium ions, and iron ions contained in the cleaning solution of the present invention respectively are 1 ppb to 500 ppb. In terms of obtaining a more highly cleaned surface, the content of the respective metal ions is preferably 300 ppb or less and more preferably 150 ppb or less. Furthermore, in terms of enhancing the productivity, the content of the respective metal ions is preferably 2 ppb or more. The content of the respective metal ions can be measured using inductively coupled plasma mass spectroscopy (ICP-MS) described later in an example. The iron ions include divalent and/or trivalent iron ions.

(Water)

The content of water contained in the cleaning solution of the present invention is preferably 30.0 to 87.0% by weight, more preferably 40.0 to 86.5% by weight, and much more preferably 50.0 to 86.0% by weight in terms of enhancing the detergency.

The cleaning solution of the present invention may contain a chelating agent such as EDTA, alcohols, a preservative, an antioxidant, and the like as arbitrary components within a range not impairing the effects of the present invention.

The pH of the cleaning solution of the present invention is preferably 5.0 or more, more preferably 5.4 or more, and much more preferably 5.8 or more in terms of enhancing the stability of the detergency of the cleaning solution. Furthermore, the pH of the cleaning solution of the present invention is preferably 8.5 or less, more preferably 8.0 or less, and much more preferably 7.5 or less in terms of enhancing the detergency. Thus, the pH of the cleaning solution of the present invention is preferably 5.0 to 8.5, more preferably 5.4 to 8.0, and much more preferably 5.8 to 7.5 in terms of enhancing the stability of the detergency and the detergency of the cleaning solution. The pH refers to a pH at 25° C. and can be measured using a pH meter (HM-30G Produced by Toa Electronics Ltd.).

Next, a method for producing a cleaning solution of the present invention will be described.

The method for producing a cleaning solution of the present invention includes, for example, treating an aqueous solution containing sodium ions, potassium ions, and iron ions respectively in an amount exceeding 500 ppb and containing sulfuric ester anions represented by the following General Formula (2) (hereinafter, which may be referred to as an "untreated solution") with a cation exchange resin and an anion exchange resin, thereby reducing the contents of the sodium ions, potassium ions, and iron ions in the above-mentioned aqueous solution respectively to 1 ppb to 500 ppb, and adding a non-metallic amine based alkali agent to the aqueous solution treated with a cation exchange resin and an anion exchange resin (hereinafter, which may be referred to as a "treated solution"). Herein, treating the aqueous solution with a cation exchange resin and an anion exchange resin refers to bringing an aqueous solution containing sodium ions, potassium ions, iron ions, and sulfuric ester anions represented by the following General Formula (2) into contact with a cation exchange resin and an anion exchange resin and allowing the cation exchange resin and the anion exchange resin to adsorb the sodium ions, potassium ions, and iron ions to remove them.

$$ROSO_3^- \qquad (2)$$

In General Formula (2), the carbon number of R is preferably 10 to 18 and more preferably 11 to 15 in terms of enhancing the cleaning property. Specific examples of R include alkyl groups or alkenyl groups such as capryl, caprin, decyl, lauryl, myristyl, palmityl, stearyl, arachidyl, behenyl, or oleyl. In terms of enhancing the cleaning property and in terms of enhancing the yield of a treated solution obtained by treating the above-mentioned untreated solution with a cation exchange resin and an anion exchange resin, the sulfuric ester anions are preferably derived from ammonium decyl sulfate or ammonium lauryl sulfate and are more preferably derived from ammonium lauryl sulfate.

The concentration of a supply source of the sulfuric ester anions in the above-mentioned untreated solution is preferably 1 to 80% by weight, more preferably 1 to 70% by weight, and much more preferably 5 to 60% by weight in terms of enhancing the yield of the treated solution and enhancing the efficiency of the treatment with a cation exchange resin and an anion exchange resin.

The sodium ions, potassium ions, and iron ions in the untreated solution are derived from impurities contained inevitably in the production process of the supply source of the sulfuric ester anions used for preparing the aqueous solution, water used for preparing the untreated solution, or the like. In the present invention, for example, an untreated solution containing sodium ions, potassium ions, and iron ions respectively in an amount exceeding 500 ppb and containing the sulfuric ester anions represented by General Formula (2) is treated. Each content of the sodium ions, potassium ions, and iron ions contained in the untreated solution generally is 100 to 500 ppm, 60 to 400 ppm, and 30 to 250 ppm.

Examples of water to be used for preparing the untreated solution include ultra-pure water, pure water, ion exchange water, and distilled water. Among them, ultra-pure water, pure water, and ion exchange water are preferred, ultra-pure water and pure water are more preferred, and ultra-pure water is much more preferred in terms of further reducing the contents of the sodium ions, potassium ions, and iron ions in the cleaning solution of the present invention and enhancing the cleaning property of a cleaning solution to be obtained. On the other hand, among ultra-pure water, pure water, and ion exchange water, ion exchange water is preferred in terms of a cost.

Herein, pure water and ultra-pure water refer to water obtained by allowing tap water to pass through active carbon, subjecting the resultant water to an ion exchange treatment, further distilling the water, and irradiating the water with light of a predetermined ultraviolet germicidal lamp or allowing the water to pass through a filter, if required. For example, the electric conductivity at 25° C. is 2 µS/cm or less in the case of ion exchange water, 1 µS/cm or less in the case of pure water, and 0.1 µS/cm or less in the case of ultra-pure water in most cases. The electric conductivity can be measured by an electric conductivity meter (RG-11A manufactured by Japan Organo Co, Ltd.)

(Metal Ion Removing Step)

In the metal ion removing step, the contents of the sodium ions, potassium ions, and iron ions in an untreated solution respectively are reduced using both a cation exchange resin and an anion exchange resin. Cations contained in the untreated solution (metal ions derived from a supply source of sulfuric ester anions, metal ions derived from water) exchange-adsorb to a cation exchange resin, and anions such as Cl⁻ exchange-adsorb to an anion exchange resin. In the metal ion removing step, such an irreversible reaction is effected. Therefore, the contents of the sodium ions, potassium ions, and iron ions contained in the untreated solution can be reduced to 1 ppb to 500 ppb, respectively.

Conventionally, in order to remove cations such as sodium ions, a cation exchange resin is used, and in order to remove anions such as fluoride ions, an anion exchange resin is used. However, when the anion exchange resin is used, anions that are not desired to adsorb to the anion exchange resin also are exchanged with counterions of the anion exchange resin. Thus, the yield of a treated solution is poor. Therefore, conventionally, in the case where the cation exchange resin and the anion exchange resin are used together, a compound having a relatively large molecular weight is subjected to an ion exchange treatment (see, for example, Patent Literature 5). However, the inventors of the present application found an unexpected fact that, even if a supply source of sulfuric ester anions having a relatively small weight-average molecular weight of, for example, less than 500 is treated with a cation exchange resin and an anion exchange resin, the sulfuric ester anions ($ROSO_3^-$) hardly adsorb to the anion exchange resin.

Therefore, according to the production method of the present invention, in the metal ion removing step, a treated solution in which each content of sodium ions, potassium ions, and iron ions is 1 ppb to 500 ppb can be obtained with good yield, and anions such as fluoride ions also can be removed.

Examples of the cation exchange resin to be used in the metal ion removing step include a strongly acidic cation exchange resin and a weakly acidic cation exchange resin. Furthermore, an H-type cation exchange resin is preferred as being able to remove sodium ions with low ion selectivity. As a method for converting a salt-type cation exchange resin into an H-type cation exchange resin, there is a method for treating a salt-type cation exchange resin with a hydrochloric acid aqueous solution or a sulfuric acid aqueous solution, and thereafter, cleaning the resultant salt-type cation exchange resin with desalted water.

Examples of the strongly acidic cation exchange resin include resins having a sulfonic group. Specific examples thereof include Diaion SK1B, SK104, SK110, SK112, UBK08, UBK530, PK208, PK212, PK216H, PK220, PK228, and HPK25 (product names) manufactured by Mitsubishi Chemical Corporation, and Amberlite IR120B, IR124, 200T, 201B, 252, and IR118 (product names) manufactured by Japan Organo Co., Ltd.

Examples of the weakly acidic cation exchange resin include methacrylic acid based resin and acrylic acid based resin having a carboxylic acid group. Specific examples thereof include Diaion WK10, WK11, WK100, WT01S, and WK40L (product names) manufactured by Mitsubishi Chemical Corporation, and Amberlite FPC3500 and IRC76 (product names) manufactured by Japan Organo Co., Ltd.

In the case where the pH of the untreated solution is less than 5, it is preferred to use a strongly acidic cation exchange resin that can be used at any value of pH. In the case where the pH of the untreated solution is 5 or more, it is preferred to use a weakly acidic cation exchange resin that has a large total exchange capacity of ions and is reproduced easily.

Examples of the anion exchange resin include a strongly basic anion exchange resin and a weakly basic anion exchange resin. Furthermore, the anion exchange resin is preferably an OH-type that is capable of removing fluoride ions with low ion selectivity, considering the mixing of fluoride ions in an untreated solution. As a method for converting a Cl-type anion exchange resin into an OH-type anion exchange resin, there is a method for treating a Cl-type anion exchange resin with a sodium hydroxide aqueous solution and then cleaning the resultant resin with desalted water.

Examples of the strongly basic anion exchange resin include resins having a quaternary ammonium group as an ion exchange group. Specific examples thereof include Diaion SA10A, SA11A, SA12A, NSA100, SA20A, SA21A, UBA120, PA308, PA312, PA316, PA408, PA412, and PA418 (product names) manufactured by Mitsubishi Chemical Corporation, and Amberlite IRA400J, 401, 402BL, 410J, 411, 440B, 458, 478, IRA900, 904, 910, and 958 (product names) manufactured by Japan Organo Co., Ltd.

Examples of the weakly basic anion exchange resin include acrylic acid based, styrene-based polyamine type, and styrene-based dimethylamine type ion exchange resins having an ammonium group derived from primary to tertiary organic amines as an exchange group. Specific examples thereof include Diaion WA10, WA20, WA21J, and WA30 (product names) manufactured by Mitsubishi Chemical Corporation, and Amberlite IRA35, IRA60E, 67, IRA93ZU, and 96S (product names) manufactured by Japan Organo Co., Ltd.

In the case where the pH of an untreated solution or an untreated solution treated with a cation exchange resin exceeds 9, it is preferred to use a strongly basic anion exchange resin that can be used at any value of pH. Furthermore, in the case where the pH of an untreated solution or an untreated solution treated with a cation exchange resin is 9 or less, it is preferred to use a weakly basic anion exchange resin that has a large total exchange capacity of ions and is reproduced easily.

It is preferred to mix a cation exchange resin and an anion exchange resin in terms of reducing the contents of sodium ions, potassium ions, and iron ions, and obtaining a cleaning solution with a high detergency. Specific examples thereof include Amberlite MB-2 and EG-4 (product names) manufactured by Japan Organo Co., Ltd.

It is preferred that the cation exchange resin is used in such an amount as to ensure an exchange group capable of exchange-adsorbing theoretically all the sodium ions, potassium ions, and iron ions (sodium ions, potassium ions, and iron ions derived from water or a supply source of sulfuric ester anions) contained in an untreated solution. More specifically, assuming that the total of equivalents of sodium ions, potassium ions, and iron ions contained in an untreated solution is 1, the total of equivalents of exchange groups contained in the cation exchange resin is preferably 1 or more and more preferably 1.2 or more.

On the other hand, it is preferred that the anion exchange resin is used in such an amount as to ensure an exchange group capable of exchange-adsorbing theoretically all the anions excluding $ROSO_3^-$ and $OH^-$ so as to not effect a reversible reaction. More specifically, assuming that the total of equivalents of anions excluding $ROSO_3^-$ and $OH^-$ is 1, the total of equivalents of exchange groups contained in the anion exchange resin is preferably 1 or more and more preferably 1.2 or more.

The treatment with a cation exchange resin and an anion exchange resin may be performed by any of a batch method and a column method.

According to the batch method, a cation exchange resin and an anion exchange resin are added to the above-mentioned untreated solution to obtain a mixture, and then, the mixture is stirred for about 0.1 to 10 hours. After that, the cation exchange resin and the anion exchange resin are separated from the mixture. The separation of the cation exchange resin and the anion exchange resin can be performed by, for example, an ordinary method such as filtration and centrifugation.

According to the column method, any of a circulation system and a distribution system may be adopted. The circulation system is a method for allowing a solution to be treated (untreated solution) to pass through an ion exchange resin in the same column a plurality of times. The distribution system is a method for allowing a solution to be treated (untreated solution) to pass through an ion exchange resin in a column only once.

In the circulation system, the space velocity {supply speed of a solution to be treated $(m^3/h)$/volume of an ion exchange resin in a column $(m^3)$} is preferably $1\ h^{-1}$ or more. In the distribution system, the space velocity is preferably $100\ h^{-1}$ or less and more preferably $10\ h^{-1}$ or less in terms of enhancing the use efficiency of an ion exchange resin in the column, and is preferably $1\ h^{-1}$ or more in terms of shortening a treatment time In the case of performing the treatment with a cation exchange resin and an anion exchange resin by the column method, considering the strength of the cation exchange resin and the strength of the anion exchange resin, the load to be given to each ion exchange resin layer in a range of the above space velocity is preferably 5 MPa or less. In the case where the cation exchange resin and the anion exchange resin are mixed, the load to be given to each ion exchange resin layer is preferably 5 MPa or less.

The capacity of the column is preferably 1.2 to 5 times the volume of the ion exchange resin so that the ion exchange resin expands or contracts and the reproduction of the ion exchange resin and the cleaning operation are performed satisfactorily.

In the case where the treatment with a cation exchange resin and an anion exchange resin is performed by the column method, the cation exchange resin and the anion exchange resin respectively may fill the separate columns (multiple-hearth purification method) or mixed to fill one column (mix bed purification method). Among them, the mix bed purification method is particularly preferred for the reason that the reversible reaction can be suppressed from occurring satisfactorily.

The temperatures of the cation exchange resin and the anion exchange resin when the treatment with the cation exchange resin and the anion exchange resin is performed are preferably 15 to 80° C. and more preferably 20 to 70° C., in terms of further reducing the contents of sodium ions, potassium ions, and iron ions in an untreated solution, further suppressing the thermal decomposition of the ion exchange resin, and enhancing the workability.

According to the method for producing a cleaning solution for a substrate for a semiconductor device of the present invention, in the metal ion removing step, before the treatment with a cation exchange resin and an anion exchange resin is performed, if required, the contents of sodium ions, potassium ions, and iron ions in an untreated solution may be reduced by a method such as ultrafiltration or electrodialysis.

(Alkali Agent Adding Step)

Anon-metallic amine based alkali agent is added to an aqueous solution (treated solution) obtained by the metal ion removing step. Although $ROSO_3^-H^{30}$ contained in the treated solution does not have a high cleaning property (surface-active ability), the cleaning property can be enhanced by adding the above-mentioned non-metallic amine based alkali agent. Care should be taken so that ionic low-molecular weight impurities such as sodium ions, potassium ions, and iron ions are not mixed when an alkali agent is used. Thus, generally, it is preferred to use a highly purified product such as a high-purity drug as a non-metallic amine based alkali agent.

An example of the alkali agent includes ammonia that is an inorganic alkali agent, in terms of avoiding the corrosion of metal in wiring and the like.

Although the amount of a non-metallic amine based alkali agent is not particularly limited, the amount is preferably such that the neutralization degree is 30 to 100 mol % and more preferably such that the neutralization degree is 50 to 95 mol %, in terms of enhancing the cleaning property (surface-active ability) and avoiding the precipitation of a salt. Herein, the neutralization degree refers to a value representing a molar ratio of a non-metallic amine based alkali agent with respect to $ROSO_3^-H^+$ (non-metallic amine based alkali agent/$ROSO_3^-H^+$) by a percentage.

(Embodiment 2)

Next, a method for producing a substrate for a semiconductor device of the present invention will be described.

A method for producing a substrate for a semiconductor device of the present invention includes the step of chemically and mechanically polishing a thin film on a substrate that includes a silicon wafer and the thin film placed on a principal surface side of the silicon wafer, the step of cleaning the thin film that is chemically and mechanically polished using the cleaning solution of the present invention, and the step of bringing the cleaned thin film into contact with ultra-pure water.

Examples of the thin film include an insulating film containing silicon such as silicon oxide, silicon nitride, and polysilicon. The method for forming a thin film may be selected appropriately in accordance with a material constituting the thin film, and examples thereof include chemical-vapor deposition (CVD), physical vapor deposition (PVD), a coating method, and a plating method. The thin film has unevenness on a surface opposite to the surface on the silicon wafer side. The unevenness is formed using, for example, conventionally known lithography. Furthermore, the unevenness on the surface of the thin film opposite to the surface thereof on the silicon wafer side may be formed so as to correspond to the unevenness of a lower layer (layer on the silicon wafer side). Specifically, due to the presence of wiring between the silicon wafer and the thin film, the thin film formed by the above thin film formation method inevitably has unevenness on the surface opposite to the surface on the silicon wafer side.

The thin film can be polished by supplying a polishing solution composition to the surface of the thin film opposite to the surface thereof on the silicon wafer side and/or the surface of a polishing pad, bringing the polishing pad into contact with the opposite surface, and moving at least one of the thin film and the polishing pad relatively while applying a predetermined pressure (load) to the above opposite surface. The polishing treatment can be performed by a conventionally known polishing device, and as the polishing solution composition, a conventionally known polishing solution composition containing grains, an additive, and the like can be used.

The material for the polishing pad and the like are not limited particularly, and a conventionally known material can be used Examples of the material for the polishing pad include non-woven fabric, an organic polymer foam such as hard polyurethane foam, and an inorganic foam. Among them, the hard polyurethane foam is preferred.

The supply speed of the polishing solution composition is preferably 0.01 to 10 g/min. or less per 1 $cm^2$ of the surface to be polished.

Examples of the above method for cleaning a thin film that is chemically and mechanically polished include: a method for discharging a cleaning solution provided with an ultrasonic vibration from a nozzle with an ultrasonic oscillator and spraying the cleaning solution to the surface of the thin film; a blush scrub cleaning method; a single wafer cleaning method using a spin coating device; a method for soaking a plurality of (for example, about 25) objects to be cleaned in a cleaning solution at a time, and cleaning the objects while shaking a jig and giving an ultrasonic wave and a jet to the cleaning solution; a method for injecting or spraying a cleaning solution to an object to be cleaned; and a method for soaking an object to be cleaned in a cleaning solution that is being stirred with a paddle. Among them, in terms of obtaining a highly cleaned surface, a method for discharging a cleaning solution provided with an ultrasonic vibration from a nozzle with an ultrasonic oscillator and spraying the cleaning solution to the surface of the thin film is preferred.

The temperature of the cleaning solution of the present invention during the use is preferably 10 to 60° C., more preferably 15 to 55° C., and much more preferably 20 to 50° C., in terms of obtaining a highly cleaned surface and enhancing the workability and safety.

The step of bringing the above-mentioned cleaned thin film into contact with ultra-pure water may be performed by a conventionally known method. The step may be performed, for example, by discharging ultra-pure water provided with an ultrasonic vibration from a nozzle with an ultrasonic oscillator and spraying ultra-sonic water to the surface of the thin film cleaned with a cleaning solution.

EXAMPLES (Quantitative Analysis of Metal Ions)

The quantitative analysis of metal ion impurities in a cleaning solution was conducted using an inductively coupled plasma mass spectrometer (ICP-MS) (ICPM-8500 manufactured by Shimadzu Corporation). The ICP-MS identifies and quantifies an element by introducing an ionized atom into a mass spectrometer by the ICP. According to this method, 73 kinds of elements can be measured, and ultra-high sensitivity analysis at a ppt level can be performed.
(Preparation of a Cleaning Solution)

Example 1

Ammonium lauryl sulfate (LATEMUL AD-25 (product name) with a weight-average molecular weight of 283, manufactured by Kao Corporation) as a supply source of sulfuric ester anions represented by General Formula (2) was diluted with ion exchange water (electric conductivity: 2 μS/cm) to obtain 16% by weight of an ammonium lauryl sulfate aqueous solution (untreated solution 1). The contents of metal ion impurities in the aqueous solution were measured by the ICP-MS to be as follows: the content of sodium ions was 240 ppm, that of potassium ions was 220 ppm, and that of iron ions was 180 ppm.

Next, a pressure-proof glass column (inner diameter: 26 mm, length: 500 mm) was filled with 240 ml of an anion exchange resin (an OH-type converted from a Cl-type "Amberlite IRA400 (product name) manufactured by Japan Organo Co., Ltd.").

On the other hand, another pressure-proof glass column (inner diameter: 26 mm, length: 500 mm) was filled with 240 ml of a cation exchange resin (an H-type converted from an Na-type "Diaion SK1B (product name), manufactured by Mitsubishi Chemical Corporation").

Then, the above untreated solution 1 was allowed to pass through the column filled with the anion exchange resin at a space velocity of 5 h$^{-1}$ (flow rate: 1200 ml/h) and pass through the column filled with the cation exchange resin at a space velocity of 5 h$^{-1}$ (flow rate: 1200 ml/h). To 500 g of the obtained treated solution, 17 g of 28 mol % ammonia water (reagent chemicals manufactured by Sigma-Aldrich Corporation) and 15 g of ultra-pure water (Ultrapur manufactured by Kanto Chemical Co., Ltd.) were added, whereby 532 g (pH 6.5) of a cleaning solution containing 15% by weight of ammonium lauryl sulfate was obtained. The contents of sodium ions, potassium ions, and iron ions in the obtained cleaning solution were measured by the ICP-MS. Table 2 shows the results.

Example 2

A pressure-proof glass column (inner diameter: 26 mm, length: 500 mm) was filled with 480 ml of a mixture of a cation exchange resin and an anion exchange resin (Amberlite MB-2 (product name) manufactured by Japan Organo Co., Ltd.).

Next, the above untreated solution 1 prepared in Example 1 was allowed to pass through the column filled with the mixture of the cation exchange resin and the anion exchange resin at a space velocity of 10 h$^{-1}$ (flow rate: 4800 ml/h). To 500 g of the obtained treated solution, 17 g of 28 mol % ammonia water (reagent chemicals manufactured by Sigma-Aldrich Corporation) and 15 g of ultra-pure water (Ultrapur manufactured by Kanto Chemical Co., Ltd.) were added, whereby 532 g (pH 6.5) of a cleaning solution containing 15% by weight of ammonium lauryl sulfate was obtained. The contents of sodium ions, potassium ions, and iron ions in the obtained cleaning solution were measured by the ICP-MS. Table 2 shows the results.

Example 3

As a supply source of sulfuric ester anions represented by General Formula (2), ammonium oleyl sulfate (with a weight-average molecular weight of 365, obtained by allowing oleyl alcohol (manufactured by Kyowa Tecnos Co., Ltd.) and concentrated sulfuric acid (manufactured by Sumitomo Chemical Co., Ltd.) to react with each other to obtain a sulfuric ester, and neutralizing the resultant product with ammonia water (manufactured by Showa Denko K.K)) was diluted with ion exchange water (electric conductivity: 2 μS/cm), whereby 16% by weight of an ammonium oleyl sulfate aqueous solution (untreated solution 2) was obtained. The contents of metal ion impurities in the aqueous solution were measured by the ICP-MS to be as follows: the content of sodium ions was 830 ppm, that of potassium ions was 120 ppm, and that of iron ions was 100 ppm.

Next, a pressure-proof glass column (inner diameter: 26 mm, length: 500 mm) was filled with 240 ml of an anion exchange resin (an OH-type converted from a Cl-type "Amberlite IRA400 (product name) manufactured by Japan Organo Co., Ltd.").

On the other hand, another pressure-proof glass column (inner diameter: 26 mm, length: 500 mm) was filled with 240 ml of a cation exchange resin (an H-type converted from an Na-type "Diaion SK1B (product name) manufactured by Mitsubishi Chemical Corporation").

Then, the above-mentioned untreated solution 2 was allowed to pass through the column filled with the anion exchange resin at a space velocity of 5 h$^{-1}$ (flow rate: 1200 ml/h) and pass through the column filled with the cation exchange film at a space velocity of 5 h$^{-1}$ (flow rate: 1200 ml/h). To 500 g of the obtained treated solution, 11 g of 28 mol % ammonia water (reagent chemicals manufactured by Sigma-Aldrich Corporation) and 10 g of ultra-pure water (Ultrapur manufactured by Kanto Chemical Co., Ltd) were added, whereby 521 g (pH 6.5) of a cleaning solution containing 15% by weight of ammonium oleyl sulfate was obtained. The contents of sodium ions, potassium ions, and iron ions in the obtained cleaning solution were measured by the ICP-MS. Table 2 shows the results.

Example 4

As a supply source of sulfuric ester anions represented by General Formula (2), ammonium decyl sulfate (with a weight-average molecular weight of 255, obtained by allowing KALCOL 1098 (decyl alcohol manufactured by Kao Corporation) and concentrated sulfuric acid (manufactured by Sumitomo Chemical Co., Ltd.) to react with each other to obtain a sulfuric ester, and neutralizing the resultant product with ammonia water (manufactured by Showa Denko K.K.)) was diluted with ion exchange water (electric conductivity: 2 μS/cm), whereby 16% by weight of an ammonium decyl sulfate aqueous solution (untreated solution 3) was obtained.

The contents of metal ion impurities in the aqueous solution were measured by the ICP-MS to be as follows: the content of sodium ions was 390 ppm, that of potassium ions was 170 ppm, and that of iron ions was 120 ppm.

Next, a pressure-proof glass column (inner diameter: 26 mm, length: 500 mm) was filled with 480 ml of a mixture of cation exchange resin and an anion exchange resin (Amberlite MB-2 (Product name) manufactured by Japan Organo Co., Ltd.).

Then, the above-mentioned untreated solution 3 was allowed to pass through the above-mentioned column at a space velocity of 10 h$^{-1}$ (flow rate: 4800 ml/h). To 500 g of the obtained treated solution, 14 g of 28 mol % ammonia water (reagent chemicals manufactured by Sigma-Aldrich Corporation) and 12 g of ultra-pure water (Ultrapur manufactured by Kanto Chemical Co., Ltd.) were added, whereby 526 g (pH 6.4) of a cleaning solution containing 15% by weight of ammonium decyl sulfate was obtained. The contents of sodium ions, potassium ions, and iron ions in the obtained cleaning solution were measured by the ICP-MS. Table 2 shows the results.

Example 5

As a supply source of sulfuric ester anions represented by General Formula (2), ammonium behenyl sulfate (with a weight-average molecular weight of 423, obtained by allowing KALCOL 220-80 (behenyl alcohol manufactured by Kao Corporation) and concentrated sulfuric acid (manufactured by Sumitomo Chemical Co., Ltd.) to react with each other to obtain a sulfuric ester, and neutralizing the resultant product with ammonia water (manufactured by Showa Denko K.K.)) was diluted with ion exchange water (electric conductivity: 2 μS/cm), whereby 16% by weight of an ammonium behenyl sulfate aqueous solution (untreated solution 4) was prepared. The contents of metal ion impurities in the aqueous solution were measured by the ICP-MS to be as follows: the content of sodium ions was 250 ppm, that of potassium ions was 120 ppm, and that of iron ions was 120 ppm.

Next, a pressure-proof glass column (inner diameter: 26 mm, length: 500 mm) was filled with 240 ml of an anion exchange resin (an OH-type converted from a Cl-type "Amberlite IRA400 (product name) manufactured by Japan Organo Co., Ltd.").

On the other hand, another pressure-proof glass column (inner diameter: 26 mm, length: 500 mm) was filled with 240 ml of a cation exchange resin (an H-type converted from an Na-type "Diaion SK1B (product name) manufactured by Mitsubishi Chemical Corporation").

The above-mentioned untreated solution 4 was allowed to pass through the above-mentioned column filled with an anion exchange resin at a space velocity of 5 h$^{-1}$ (flow rate: 1200 ml/h) and pass through the column filled with a cation exchange resin at a space velocity of 5 h$^{-1}$ (flow rate: 1200 ml/h). To 500 g of the obtained treated solution after the passage through the columns, 17 g of 28 mol % ammonia water (reagent chemicals manufactured by Sigma-Aldrich Corporation) and 15 g of ultra-pure water (Ultrapur manufactured by Kanto Chemical Co., Ltd.) were added, whereby 532 g (pH 6.6) of a cleaning solution containing 15% by weight of ammonium behenyl sulfate was obtained. The contents of sodium ions, potassium ions, and iron ions in the obtained cleaning solution were measured by the ICP-MS. Table 2 shows the results.

Example 6

As a supply source of sulfuric ester anions represented by General Formula (2), ammonium capryl sulfate (with a weight-average molecular weight of 235, obtained by allowing KALCOL 0898 (octyl alcohol manufactured by Kao Corporation) and concentrated sulfuric acid (manufactured by Sumitomo Chemical Co., Ltd.) to react with each other to obtain a sulfuric ester, and neutralizing the resultant product with ammonia water (manufactured by Showa Denko K.K.)) was diluted with ion exchange water (electric conductivity: 2 μS/cm), whereby 16% by weight of an ammonium capryl sulfate aqueous solution (untreated solution 5) was prepared. The contents of metal ion impurities in the aqueous solution were measured by the ICP-MS to be as follows: the content of sodium ions was 240 ppm, that of potassium ions was 120 ppm, and that of iron ions was 90 ppm.

Next, a pressure-proof glass column (inner diameter: 26 mm, length: 500 mm) was filled with 480 ml of a mixture of a cation exchange resin and an anion exchange resin (Amberlite MB-2 (product name) manufactured by Japan Organo Co., Ltd.).

Then, the above-mentioned untreated solution 5 was allowed to pass through the above-mentioned column at a space velocity of 10 h$^{-1}$ (flow rate: 4800 ml/h). 500 g of the obtained treated solution, 17 g of 28 mol % ammonia water (reagent chemicals manufactured by Sigma-Aldrich Corporation) and 15 g of ultra-pure water (Ultrapur manufactured by Kanto Chemical Co., Ltd.) were added, whereby 532 g (pH 6.4) of a cleaning solution containing 15% by weight of ammonium capryl sulfate was obtained. The contents of sodium ions, potassium ions, and iron ions in the obtained cleaning solution were measured by the ICP-MS. Table 2 shows the results.

Examples 7-10

The treated cleaning solution prepared in Example 1 and 15% by weight of an ammonium lauryl sulfate aqueous solution obtained by adjusting ammonium lauryl sulfate (LATEMUL AD-25 (product name) with a weight-average molecular weight of 283, manufactured by Kao Corporation) with ion exchange water (electric conductivity: 2 μS/cm) so that the concentration became 15% by weight, were mixed in weight ratios described in Table 1, whereby cleaning solutions of Examples 7-10 were obtained. The contents of sodium ions, potassium ions, and iron ions in each cleaning solution thus obtained was measured by the ICP-MS. Table 2 shows the results.

TABLE 1

|  | Cleaning solution containing 15% by weight of ammonium lauryl sulfate prepared in Example 1 (% by weight) | 15% by weight of ammonium lauryl sulfate aqueous solution (% by weight) | pH |
|---|---|---|---|
| Example 7 | 99.820 | 0.180 | 6.5 |
| Example 8 | 99.922 | 0.078 | 6.5 |
| Example 9 | 99.963 | 0.037 | 6.5 |
| Example 10 | 99.989 | 0.011 | 6.5 |
| Comparative Example 3 | 99.688 | 0.312 | 6.5 |

Example 11

As a supply source of sulfuric ester anions represented by General Formula (2), ammonium lauryl sulfate (LATEMUL AD-25 (product name) with a weight-average molecular weight of 283, manufactured by Kao Corporation) was diluted with ion exchange water (electric conductivity: 2 μS/cm) to obtain 11% by weight of an ammonium lauryl sulfate aqueous solution (untreated solution 6). The contents of metal ion impurities in the aqueous solution were measured by the ICP-MS to be as follows: the content of sodium ions was 230 ppm, that of potassium ions was 100 ppm, and that of iron ions was 70 ppm.

Next, a pressure-proof glass column (inner diameter: 26 mm, length: 500 min) was filled with 240 ml of an anion exchange resin (an OH-type converted from a Cl-type "Amberlite IRA400 (product name) manufactured by Japan Organo Co., Ltd.").

On the other hand, another pressure-proof glass column (inner diameter: 26 mm, length: 500 mm) was filled with 240 ml of a cation exchange resin (an H-type converted from an Na-type "Diaion SK1B (product name), manufactured by Mitsubishi Chemical Corporation").

Then, the above untreated solution 6 was allowed to pass through the column filled with the anion exchange resin at a space velocity of 5 h$^{-1}$ (flow rate: 1200 ml/h) and pass through the column filled with the cation exchange resin at a space velocity of 5 h$^{-1}$ (flow rate: 1200 ml/h). To 500 g of the obtained treated solution, 11 g of 28 mol % ammonia water (reagent chemicals manufactured by Sigma-Aldrich Corporation) and 10 g of ultra-pure water (Ultrapur manufactured by Kanto Chemical Co., Ltd.) were added, whereby 521 g (pH 6.5) of a cleaning solution containing 10% by weight of ammonium lauryl sulfate was obtained. The contents of sodium ions, potassium ions, and iron ions in the obtained cleaning solution were measured by the ICP-MS. Table 2 shows the results.

Example 12

As a supply source of sulfuric ester anions represented by General Formula (2), ammonium lauryl sulfate (LATEMUL AD-25 (product name) with a weight-average molecular weight of 283, manufactured by Kao Corporation) was diluted with ion exchange water (electric conductivity: 2 μS/cm) to obtain 5.4% by weight of an ammonium lauryl sulfate aqueous solution (untreated solution 7). The contents of metal ion impurities in the aqueous solution were measured by the ICP-MS to be as follows: the content of sodium ions was 210 ppm, that of potassium ions was 90 ppm, and that of iron ions was 60 ppm.

Next, a pressure-proof glass column (inner diameter: 26 mm, length: 500 mm) was filled with 240 ml of an anion exchange resin (an OH-type converted from a Cl-type "Amberlite IRA400 (product name) manufactured by Japan Organo Co., Ltd.).

On the other hand, another pressure-proof glass column (inner diameter: 26 mm, length: 500 mm) was filled with 240 ml of a cation exchange resin (an H-type converted from an Na-type "Diaion SK1B (product name), manufactured by Mitsubishi Chemical Corporation").

Then, the above untreated solution 7 was allowed to pass through the column filled with an anion exchange resin at a space velocity of 5 h$^{-1}$ (flow rate: 1200 ml/h) and pass through the column filled with a cation exchange resin at a space velocity of 5 h$^{-1}$ (flow rate: 1200 ml/h). To 500 g of the obtained treated solution, 6 g of 28 mol % ammonia water (reagent chemicals manufactured by Sigma-Aldrich Corporation) and 5 g of ultra-pure water (Ultrapur manufactured by Kanto Chemical Co., Ltd.) were added, whereby 511 g (pH 6.5) of a cleaning solution containing 5% by weight of ammonium lauryl sulfate was obtained. The contents of sodium ions, potassium ions, and iron ions in the obtained cleaning solution were measured by the ICP-MS. Table 2 shows the results.

Example 13

As a supply source of sulfuric ester anions represented by General Formula (2), ammonium lauryl sulfate (LATEMUL AD-25 (product name) with a weight-average molecular weight of 283, manufactured by Kao Corporation) was diluted with ion exchange water (electric conductivity: 2 μS/cm) to obtain 76% by weight of an ammonium lauryl sulfate aqueous solution (untreated solution 8). The content of metal ion impurities in the aqueous solution was measured by the ICP-MS to be as follows: the content of sodium ions was 430 ppm, that of potassium ions was 230 ppm, and that of iron ions was 190 ppm.

Next, a pressure-proof glass column (inner diameter: 26 mm, length: 500 mm) was filled with 240 ml of an anion exchange resin (an OH-type converted from a Cl-type "Amberlite IRA400 (product name) manufactured by Japan Organo Co., Ltd.).

On the other hand, another pressure-proof glass column (inner diameter: 26 mm, length: 500 mm) was filled with 240 ml of a cation exchange resin (an H-type converted from an Na-type "Diaion SK1B (product name), manufactured by Mitsubishi Chemical Corporation).

Then, the above untreated solution 8 was allowed to pass through the column filled with the anion exchange resin at a space velocity of 5 h$^{-1}$ (flow rate: 1200 ml/h) and pass through the column filled with the cation exchange resin at a space velocity of 5 h$^{-1}$ (flow rate: 1200 ml/h). To 500 g of the obtained treated solution, 83 g of 28 mol % ammonia water (reagent chemicals manufactured by Sigma-Aldrich Corporation) was added, whereby 583 g of a cleaning solution (pH 6.5) containing 65% by weight of ammonium lauryl sulfate was obtained. The contents of sodium ions, potassium ions, and iron ions in the obtained cleaning solution were measured by the ICP-MS. Table 2 shows the results.

Comparative Example 1

A pressure-proof glass column (inner diameter: 26 mm, length: 500 mm) was filled with 480 ml of a cation exchange resin (an H-type converted from an Na-type "Amberlyst 15 (product name) manufactured by Rohm and Haas Co., Ltd.").

The above-mentioned untreated solution 1 prepared in Example 1 was allowed to pass through the above-mentioned column at a space velocity of 10 h$^{-1}$ (flow rate: 4800 ml/h). To 500 g of the obtained treated solution, 17 g of 28 mol % ammonia water (reagent chemicals manufactured by Sigma-Aldrich Corporation) and 15 g of ultra-pure water (Ultrapur manufactured by Kanto Chemical Co., Ltd) were added, whereby 532 g (pH 6.5) of a cleaning solution containing 15% by weight of ammonium lauryl sulfate was obtained. The contents of sodium ions, potassium ions, and iron ions in the obtained cleaning solution were measured by the ICP-MS. Table 2 shows the results.

Comparative Example 2

A pressure-proof glass column (inner diameter: 26 mm, length: 500 mm) was filled with 480 ml of an anion exchange resin (an OH-type converted from a Cl-type "Duolite A-561 (product name) manufactured by Sumitomo Chemical Co., Ltd.").

The above-mentioned untreated solution 1 prepared in Example 1 was allowed to pass through the above-mentioned column at a space velocity of 10 h$^{-1}$ (flow rate: 4800 ml/h). To 500 g of the obtained treated solution, 17 g of 28 mol % ammonia water (reagent chemicals manufactured by Sigma-Aldrich Corporation) and 15 g of ultra-pure water (Ultrapur manufactured by Kanto Chemical Co., Ltd.) were added, whereby 532 g (pH 6.5) of a cleaning solution containing 15% by weight of ammonium lauryl sulfate was obtained. The contents of sodium ions, potassium ions, and iron ions in the obtained cleaning solution were measured by the ICP-MS. Table 2 shows the results.

(Comparative Example 3

The treated cleaning solution prepared in Example 1 was mixed with 15% by weight of an ammonium lauryl sulfate aqueous solution A obtained by adjusting ammonium lauryl sulfate (LATEMUL AD-25 (product name) with a weight-average molecular weight of 283, manufactured by Kao Corporation) with ion exchange water so that the concentration thereof was 15% by weight, whereby a cleaning solution (pH 6.5) containing 15% by weight of ammonium lauryl sulfate was obtained. The contents of sodium ions, potassium ions, and iron ions in the cleaning solution thus obtained were measured by the ICP-MS. Table 2 shows the results.

Comparative Example 4

As a polymer compound having a base-generating group, ammonium polyacrylate (POIZ 532A (product name) with a weight-average molecular weight of 7000 (polyacryl conversion), manufactured by Kao Corporation) was diluted with ion exchange water (electric conductivity: 2 µS/cm) to prepare 32% by weight of an ammonium polyacrylate aqueous solution (untreated solution 9). The contents of metal ion impurities in the aqueous solution were measured by the ICP-MS to be as follows: the content of sodium ions was 21 ppm, that of potassium ions was 10 ppm, and that of iron ions was 2 ppm.

Next, a pressure-proof glass column (inner diameter: 26 mm, length: 500 mm) was filled with 480 ml of a mixture of a cation exchange resin and an anion exchange resin ("Amberlite MB-2 (product name) manufactured by Japan Organo Co., Ltd.").

Then, the above untreated solution 9 was allowed to pass through the above-mentioned column at a space velocity of 10 h$^{-1}$ (flow rate: 4800 ml/h). To 500 g of the obtained treated solution, 60 g of 28 mol % ammonia water (reagent chemicals manufactured by Sigma-Aldrich Corporation) was added, whereby 560 g (pH 6.2) of a cleaning solution containing 29% by weight of ammonium polyacrylate was obtained. The contents of sodium ions, potassium ions, and iron ions in the obtained cleaning solution were measured by the ICP-MS. Table 2 shows the results.

Comparative Example 5

To a glass reaction apparatus equipped with an internal cooler, a stirring device, a cooling unit with an open/dose cock for evaporating a solvent, and a liquid introducing device, 2,224 g (22.9 mol) of a 35% by mass hydrogen peroxide solution was added, and 663 g of thioglycolic acid (7.2 mol) was continuously fed to the apparatus by 2 mL/min. from a liquid introduction port with stirring. During this time, the liquid temperature was held at 50° C. by regulating the amount of cooling water to the cooling unit. After the addition of thioglycolic acid was completed, the stirring was continued at 50° C. for 2 hours. Nitrogen gas was blown into the reaction liquid from a sample introduction tube. The resultant reaction liquid was boiled at an atmospheric pressure with stirring, and kept for 5 hours while a part of the vapor was being removed outside of the system, whereby 42% by mass of a sulfoacetic acid aqueous solution (yield: 2,270 g) was obtained. A part of the aqueous solution was allowed to pass through a column of 35 mmφ filled with 200 mL of an ion exchange resin (Duolite A-561 manufactured by Sumitomo Chemical Co., Ltd.) from a column top (down flow) at a space velocity of 0.5 and purified, whereby a cleaning solution (pH 5.1) containing 40% by weight of sulfoacetic acid was obtained. The contents of sodium ions, potassium ions, and iron ions in the obtained cleaning solution were measured by the ICP-MS. Table 2 shows the results.

Comparative Example 6

To a container of an inner capacity of 2 liters charged with 1,000 g of ion exchange water and 14 g of a 35% by mass hydrogen peroxide solution, 500 g of a 20% by mass acrylic acid aqueous solution was dropped equally with stirring under a reflux over 10 hours. After the completion of dropping, the mixture was kept under a reflux for 2 hours, whereby an acrylic acid polymer (1) (Mw=2,000) was obtained. Then, a solution containing the above-mentioned acrylic acid polymer (1) and tetramethylammonium hydroxide were mixed with ion exchange water so that the amount of the polymer was 10% by mass and the amount of tetramethylammonium hydroxide was 2% by mass based on 100% by mass of the mixture, whereby a cleaning solution (pH 6.3) containing 12% by weight of a polyacrylic tetramethyl ammonium hydroxide salt (Mw=2,000) was obtained. The contents of sodium ions, potassium ions, and iron ions in the obtained cleaning solution were measured by the ICP-MS. Table 2 shows the results.

Comparative Example 7

The following components were mixed to obtain a cleaning solution (pH 6.2) of
Comparative Example 7. The contents of sodium ions, potassium ions, and iron ions in the obtained cleaning solution were measured by the ICP-MS. Table 2 shows the results.

| | |
|---|---|
| Citric acid | 0.5% by weight |
| (Product name: Citric acid manufactured by Kyushu Kako Co. Ltd.) | |
| Tetramethylammonium hydroxide | 0.3% by weight |
| (Product name: Tetramethylammonium hydroxide manufactured by Toyo Gosei Co., Ltd.) | |
| Dodecylbenzenesulfonic acid | 0.007% by weight |
| (Product name: NEOPELEX GS manufactured by Kao Corporation) | |
| Ultra-pure water | 99.193% by weight |
| (Ultrapur manufactured by Kanto Chemical Co., Ltd.) | |

Comparative Example 8

The following components were mixed to obtain a cleaning solution (pH 6.8) of Comparative Example 8. The contents of sodium ions, potassium ions, and iron ions in the obtained cleaning solution were measured by the ICP-MS. Table 2 shows the results.

| Polyoxyethylenelauryl ether (Product name: EMULGEN 108 with an average additional molar number of 8, manufactured by Kao Corporation) | 0.1% by weight |
|---|---|
| Ultra-pure water (Ultrapur manufactured by Kanto Chemical Co., Ltd.) | 99.9% by weight |

Comparative Example 9

The following components were mixed to obtain a cleaning solution (pH 6.7) of Comparative Example 8. The contents of sodium ions, potassium ions, and iron ions in the obtained cleaning solution were measured by the ICP-MS. Table 2 shows the results.

| Ammonium methanesulfonate (Product name: Ammonium methanesulfonate manufactured by Chevron Phillips Chemical International Ltd.) | 2.5% by weight |
|---|---|
| Ultra-pure water (Ultrapur manufactured by Kanto Chemical Co., Ltd.) | 97.5% by weight |

Comparative Example 10

Ultra-pure water (Ultrapur manufactured by Kanto Chemical Co., Ltd.) was used as a cleaning solution.

TABLE 2

| | No. | Supply source of sulfuric ester anions of Formula (2) (Main component or surfactant regarding Comparative Examples 4-9) | Content of aliphatic acid hydrocarbon ammonium sulfate of Formula (1) contained in cleaning solution (% by weight) (Main component or surfactant contained in cleaning solution regarding Comparative Examples 4-9) | Ion exchange resin using removal of metal | Sodium ion (ppb) | Potassium ion (ppb) | Iron ion (ppb) |
|---|---|---|---|---|---|---|---|
| Example | 1 | Ammonium lauryl sulfate | 15 | Anion exchange resin 1*) Cation exchange resin 2*) | 32 | 10 | 9 |
| | 2 | Ammonium lauryl sulfate | 15 | Mixture of cation exchange resin and anion exchange resin 3*) | 11 | 7 | 6 |
| | 3 | Ammonium oleyl sulfate | 15 | Anion exchange resin 1*) Cation exchange resin 2*) | 35 | 12 | 11 |
| | 4 | Ammonium decyl sulfate | 15 | Mixture of cation exchange resin and anion exchange resin 3*) | 14 | 9 | 8 |
| | 5 | Ammonium behenyl sulfate | 15 | Anion exchange resin 1*) Cation exchange resin 2*) | 35 | 13 | 10 |
| | 6 | Ammonium capryl sulfate | 15 | Mixture of cation exchange resin and anion exchange resin 3*) | 14 | 10 | 8 |
| | 7 | Ammonium lauryl sulfate | 15 | Anion exchange resin 1*) Cation exchange resin 2*) | 463 | 403 | 326 |
| | 8 | Ammonium lauryl sulfate | 15 | Anion exchange resin 1*) Cation exchange resin 2*) | 218 | 180 | 150 |
| | 9 | Ammonium lauryl sulfate | 15 | Anion exchange resin 1*) Cation exchange resin 2*) | 120 | 89 | 73 |
| | 10 | Ammonium lauryl sulfate | 15 | Anion exchange resin 1*) Cation exchange resin 2*) | 58 | 34 | 28 |
| | 11 | Ammonium lauryl sulfate | 10 | Anion exchange resin 1*) Cation exchange resin 2*) | 29 | 9 | 8 |
| | 12 | Ammonium lauryl sulfate | 5 | Anion exchange resin 1*) Cation exchange resin 2*) | 27 | 8 | 7 |
| | 13 | Ammonium lauryl sulfate | 65 | Anion exchange resin 1*) Cation exchange resin 2*) | 63 | 22 | 19 |
| Comparative Example | 1 | Ammonium lauryl sulfate | 15 | Cation exchange resin 4*) | 2380 | 1620 | 851 |
| | 2 | Ammonium lauryl sulfate | 15 | Anion exchange resin 5*) | 4150 | 2790 | 1160 |
| | 3 | Ammonium lauryl sulfate | 15 | — | 781 | 696 | 577 |
| | 4 | Ammonium polyacrylate | 29 | Mixture of cation exchange resin and anion exchange resin 6*) | 18 | 11 | 8 |
| | 5 | Sulfoacetic acid | 40 | Ion exchange resin 7*) | 10 | 8 | 8 |
| | 6 | Polyacrylic tetramethylammonium hydroxide salt | 12 | | 116 | 85 | 72 |
| | 7 | Tetramethylammonium hydroxide | 0.3 | | 12 | 9 | 8 |
| | 8 | Polyoxyethylenelauryl ether | 0.1 | | 14 | 11 | 9 |
| | 9 | Ammonium methanesulfonate | 2.5 | | 29 | 14 | 11 |
| | 10 | Ultra-pure water | 100 | | 20 | 15 | 13 |

1*) Anion exchange resin (OH-type converted from Cl-type "Amberlite IRA400 (product name) manufactured by Japan Organo Co., Ltd.")
2*) Cation exchange resin (H-type converted from Na-type "Diaion SK1B (product name), manufactured by Mitsubishi Chemical Corporation")
3*) Mixture of cation exchange resin and anion exchange resin ("Amberlite MB-2 (product name) manufactured by Japan Organo Co., Ltd.")
4*) Cation exchange resin (H-type converted from Na-type "Amberlyst 15 (product name) manufactured by Rohm and Haas Co., Ltd.")
5*) Anion exchange resin (OH-type converted from Cl-group type "Duolite A-561 (product name) manufactured by Sumitomo Chemical Co., Ltd.")
6*) Mixture of cation exchange resin and anion exchange resin ("Amberlite MB-2 (product name) manufactured by Japan Organo Co., Ltd.")
7*) Ion exchange resin ("Duolite A-561 (product name) manufactured by Sumitomo Chemical Co., Ltd.")

As is apparent from Table 2, when the cleaning solutions of Examples 1-13 are treated with a cation exchange resin and an anion exchange resin in the process of preparation thereof, the contents of sodium ions, potassium ions, and iron ions become 1 ppb to 500 ppb, respectively.

(Cleaning Test After CMP; Metal Ion Impurities Removal Test)

(1) Preparation of a Solution Contaminated with Metal Ions

Sodium chloride, potassium chloride, and iron chloride were added to ultra-pure water (Ultrapur manufactured by Kanto Chemical Co., Ltd.), whereby a contaminated solution (A) in which the concentrations of sodium ions, potassium ions, and iron ions respectively were 20 ppm was obtained.

(2) Cleaning Evaluation

A substrate (diameter: 12 inches) made of a silicon wafer and a silicon oxide insulating film placed on the silicon wafer was set on a spinner, and the contaminated solution (A) was dropped in an amount of 1 mL onto the surface of the silicon oxide insulating film. The wafer was rotated for 2 minutes (rotation speed: 60 rpm), whereby the contaminated solution (A) was applied uniformly over the entire surface of the silicon oxide insulating film to produce a sample for evaluation contaminated with the contamination solution (A). The sample for evaluation was cleaned and rinsed by the following cleaning and rinsing methods.

(a) Cleaning Method

A cleaning solution supplied with an ultrasonic vibration from a nozzle with an ultrasonic oscillator was discharged in a clean room kept at 23° C., and a sample for evaluation was cleaned with the cleaning solution. The conditions are shown below.

| (Cleaning conditions) | |
|---|---|
| Ultrasonic wave to be used: | 1.7 MHz, 48 W |
| Nozzle diameter: | 4 mmφ |
| Supply amount of cleaning solution: | 2 L/min. |
| Amount of cleaning solution to be used: | 2 L* |
| Cleaning time: | 30 sec. |
| Cleaning solution temperature: | 23° C. |

*In Comparative Example 11, 10 L of the cleaning solution of Comparative Example 10 was used.

(b) Method of Contact with Ultra-Pure Water (Rinsing Method)

Ultra-pure water supplied with an ultrasonic vibration was discharged from the above-mentioned nozzle with an ultrasonic oscillator, and the cleaned sample for evaluation was rinsed with the ultra-pure water. The rinsing conditions are the same as those of the above-mentioned cleaning conditions.

(3) Method for Evaluating Metal Ion Removal Effects

The rinsed sample for evaluation was dried, and thereafter, the residual amounts of sodium ions, potassium ions, and iron ions on the surface of the silicon oxide insulating film of the sample for evaluation were measured. For measurement of the residual amounts, a total reflection-type fluorescent X-ray wafer surface analyzer (TREX 610T (product name) manufactured by K.K. Technos IT) was used. Arbitrary three points were measured. Table 3 shows an average value of the amounts of metal ion impurities at the respective points.

TABLE 3

| | No. | Used amount of cleaning solution (L) | Residual amount of sodium ions (atoms/cm$^2$) | Residual amount of potassium ions (atoms/cm$^2$) | Residual amount of iron ions (atoms/cm$^2$) |
|---|---|---|---|---|---|
| Example | 1 | 2 | $9.5 \times 10^8$ | $8.8 \times 10^8$ | $7.7 \times 10^8$ |
| | 2 | 2 | $7.2 \times 10^8$ | $4.7 \times 10^8$ | $3.2 \times 10^8$ |
| | 3 | 2 | $1.3 \times 10^9$ | $1.0 \times 10^9$ | $9.6 \times 10^8$ |
| | 4 | 2 | $8.3 \times 10^8$ | $6.4 \times 10^8$ | $6.1 \times 10^8$ |
| | 5 | 2 | $8.6 \times 10^9$ | $7.3 \times 10^9$ | $5.5 \times 10^9$ |
| | 6 | 2 | $7.9 \times 10^9$ | $7.0 \times 10^9$ | $5.4 \times 10^9$ |
| | 7 | 2 | $9.1 \times 10^9$ | $8.8 \times 10^9$ | $8.7 \times 10^9$ |
| | 8 | 2 | $5.8 \times 10^9$ | $4.1 \times 10^9$ | $3.9 \times 10^9$ |
| | 9 | 2 | $3.7 \times 10^9$ | $2.6 \times 10^9$ | $2.3 \times 10^9$ |
| | 10 | 2 | $2.4 \times 10^9$ | $1.7 \times 10^9$ | $1.2 \times 10^9$ |
| | 11 | 2 | $4.5 \times 10^9$ | $3.7 \times 10^9$ | $3.2 \times 10^9$ |
| | 12 | 2 | $8.8 \times 10^9$ | $8.1 \times 10^9$ | $7.3 \times 10^9$ |
| | 13 | 2 | $6.7 \times 10^9$ | $6.6 \times 10^9$ | $6.1 \times 10^9$ |
| Comparative Example | 1 | 2 | $5.4 \times 10^{13}$ | $3.0 \times 10^{13}$ | $1.8 \times 10^{13}$ |
| | 2 | 2 | $4.6 \times 10^{14}$ | $2.2 \times 10^{14}$ | $2.0 \times 10^{14}$ |
| | 3 | 2 | $6.9 \times 10^{10}$ | $5.6 \times 10^{10}$ | $4.5 \times 10^{10}$ |
| | 4 | 2 | $9.2 \times 10^{12}$ | $6.1 \times 10^{12}$ | $4.8 \times 10^{12}$ |
| | 5 | 2 | $5.2 \times 10^{14}$ | $4.5 \times 10^{14}$ | $3.7 \times 10^{14}$ |
| | 6 | 2 | $6.8 \times 10^{14}$ | $6.3 \times 10^{14}$ | $4.1 \times 10^{14}$ |
| | 7 | 2 | $9.5 \times 10^{14}$ | $7.8 \times 10^{14}$ | $6.4 \times 10^{14}$ |
| | 8 | 2 | $9.7 \times 10^{14}$ | $8.7 \times 10^{14}$ | $6.9 \times 10^{14}$ |
| | 9 | 2 | $6.3 \times 10^{14}$ | $5.4 \times 10^{14}$ | $5.2 \times 10^{14}$ |
| | 10 | 2 | $9.8 \times 10^{14}$ | $8.2 \times 10^{14}$ | $7.7 \times 10^{14}$ |
| | 11 | 10 | $9.7 \times 10^{14}$ | $8.1 \times 10^{14}$ | $7.7 \times 10^{14}$ |

As shown in Table 2, the contents of sodium ions, potassium ions, and iron ions in the cleaning solutions of Examples 1-13 are equal to or higher than those of sodium ions, potassium ions, and iron ions in the cleaning solutions of Comparative Examples 4-11. Nonetheless, as shown in Table 3, the respective residual amounts of the sodium ions, the potassium ions, and the iron ions when the cleaning solutions of Examples 1-13 are used are smaller than those when the cleaning solutions of Comparative Examples 1-11 are used. It is understood from the above that a more highly cleaned surface can be obtained using the cleaning solutions of Examples 1-13, compared with the case using the cleaning solutions of Comparative Examples 1-11. Furthermore, it is understood from the comparison between the case of using the cleaning solutions of Examples 1-13 and the case of using the cleaning solution of Comparative Example 11 that a more highly cleaned surface can be obtained by the use of a smaller amount of a cleaning solution when using the cleaning solutions of Examples 1-13.

Industrial Applicability

The use of a cleaning solution of the present invention enables a highly cleaned surface to be obtained with a relatively small amount of the solution. Therefore, the cleaning solution of the present invention is useful as a cleaning solution used in the course of production of a semiconductor device.

The invention claimed is:

1. A method for producing a substrate for a semiconductor device, comprising:
   treating an aqueous solution containing a sodium ion, a potassium ion, an iron ion, and a sulfuric ester anion selected from the group consisting of a lauryl sulfate anion, an oleyl sulfate anion, a decyl sulfate anion, a behenyl sulfate anion, and a capryl sulfate anion with a cation exchange resin and an anion exchange resin, thereby reducing each content of the sodium ion, the potassium ion, and the iron ion in the aqueous solution, and adding a non-metallic amine based alkali agent to the aqueous solution treated with the cation exchange resin and the anion exchange resin to obtain a cleaning solution for a substrate for a semiconductor device,
   chemically and mechanically polishing a thin film containing silicon placed on a principal plane side of a silicon wafer;
   cleaning the thin film obtained by the chemical mechanical polishing, using the cleaning solution for a substrate for a semiconductor device; and
   bringing the thin film obtained in the cleaning into contact with ultra-pure water,
   wherein the cleaning solution for a substrate for a semiconductor device contains a sodium ion, a potassium ion, an iron ion, water, and an ammonium salt of a sulfuric ester selected from the group consisting of ammonium lauryl sulfate, ammonium oleyl sulfate, ammonium decyl sulfate, ammonium behenyl sulfate, and ammonium capryl sulfate,
   each content of the sodium ion, the potassium ion, and the iron ion is 1 ppb to 150 ppb,
   wherein the weight-average molecular weight of the ammonium salt of the sulfuric ester is less than 500;
   wherein the cation exchange resin is an H-type cation exchange resin having a sulfonic group; and
   wherein the anion exchange resin is an OH-type anion exchange resin having a quaternary ammonium group.

2. The method for producing a substrate for a semiconductor device according to claim 1, wherein pH of the cleaning solution for a substrate for a semiconductor device is 5.0 to 8.5.

3. The method for producing a substrate for a semiconductor device according to claim 1, wherein a content of a supply source of the sulfuric ester anion contained in the aqueous solution before being treated with the cation exchange resin and the anion exchange resin is 1 to 80% by weight.

4. The method for producing a substrate for a semiconductor device according to claim 1, wherein the aqueous solution before being treated with the cation exchange resin and the anion exchange resin is allowed to pass through a column filled with a mixture of the cation exchange resin and the anion exchange resin, whereby the aqueous solution is treated with the cation exchange resin and the anion exchange resin.

5. The method for producing a substrate for a semiconductor device according to claim 1, wherein R in General Formula (1) is an alkyl group with a carbon number of 11-15 or an alkenyl group with a carbon number of 11-15.

6. The method for producing a substrate for a semiconductor device according to claim 1, wherein a content of the ammonium salt of the sulfuric ester is 15 to 65% by weight.

7. The method for producing a substrate for a semiconductor device according to claim 1, wherein each content of the sodium ion, the potassium ion, and the iron ion is 1 ppb to 63 ppb.

8. A method for cleaning a substrate for a semiconductor device, comprising:
   treating an aqueous solution containing a sodium ion, a potassium ion, an iron ion, and a sulfuric ester anion selected from the group consisting of a lauryl sulfate anion, an oleyl sulfate anion, a decyl sulfate anion, a behenyl sulfate anion, and a capryl sulfate anion with a cation exchange resin and an anion exchange resin, thereby reducing each content of the sodium ion, the potassium ion, and the iron ion in the aqueous solution, and adding a non-metallic amine based alkali agent to the aqueous solution treated with the cation exchange resin and the anion exchange resin to obtain a cleaning solution for a substrate for a semiconductor device,
   cleaning a thin film containing silicon placed on a principal plane side of a silicon wafer and polished chemically and mechanically, using the cleaning solution for a substrate for a semiconductor device; and
   bringing the thin film obtained in the cleaning into contact with ultra-pure water,
   wherein the cleaning solution for a substrate for a semiconductor device contains a sodium ion, a potassium ion, an iron ion, water, and an ammonium salt of a sulfuric ester selected from the group consisting of ammonium lauryl sulfate, ammonium oleyl sulfate, ammonium decyl sulfate, ammonium behenyl sulfate, and ammonium capryl sulfate,
   each content of the sodium ion, the potassium ion, and the iron ion is 1 ppb to 150 ppb,
   wherein the weight-average molecular weight of the ammonium salt of the sulfuric ester is less than 500;
   wherein the cation exchange resin is an H-type cation exchange resin having a sulfonic group; and
   wherein the anion exchange resin is an OH-type anion exchange resin having a quaternary ammonium group.

9. The method for cleaning a substrate for a semiconductor device according to claim 8, wherein pH of the cleaning solution for a substrate for a semiconductor device is 5.0 to 8.5.

10. The method for cleaning a substrate for a semiconductor device according to claim 8, wherein a content of a supply source of the sulfuric ester anion contained in the aqueous solution before being treated with the cation exchange resin and the anion exchange resin is 1 to 80% by weight.

11. The method for cleaning a substrate for a semiconductor device according to claim 8, wherein the aqueous solution before being treated with the cation exchange resin and the anion exchange resin is allowed to pass through a column filled with a mixture of the cation exchange resin and the anion exchange resin, whereby the aqueous solution is treated with the cation exchange resin and the anion exchange resin.

12. The method for cleaning a substrate for a semiconductor device according to claim 8, wherein R in General Formula (1) is an alkyl group with a carbon number of 11-15 or an alkenyl group with a carbon number of 11-15.

13. The method for cleaning a substrate for a semiconductor device according to claim 8, wherein a content of the ammonium salt of the sulfuric ester is 15 to 65% by weight.

14. The method for cleaning a substrate for a semiconductor device according to claim 8, wherein each content of the sodium ion, the potassium ion, and the iron ion is 1 ppb to 63 ppb.

\* \* \* \* \*